(12) United States Patent
Hsu

(10) Patent No.: US 6,858,501 B2
(45) Date of Patent: Feb. 22, 2005

(54) SELF-ALIGNED DUAL-FLOATING GATE MEMORY CELL AND METHOD FOR MANUFACTURING THE SAME

(75) Inventor: James Juen Hsu, Saratoga, CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/412,293

(22) Filed: Apr. 14, 2003

(65) Prior Publication Data
US 2003/0168692 A1 Sep. 11, 2003

Related U.S. Application Data

(62) Division of application No. 10/067,889, filed on Feb. 8, 2002, now abandoned.
(60) Provisional application No. 60/336,737, filed on Dec. 7, 2001.

(51) Int. Cl.[7] .............................................. H01L 21/336
(52) U.S. Cl. ........................................ 438/283; 438/257
(58) Field of Search ................................. 438/257–267; 257/314–326

(56) References Cited

U.S. PATENT DOCUMENTS

| 5,929,480 | A | | 7/1999 | Hisamune |
|---|---|---|---|---|
| 6,133,098 | A | | 10/2000 | Ogura et al. |
| 6,197,660 | B1 | * | 3/2001 | Jang et al. .................. 438/427 |
| 6,271,090 | B1 | * | 8/2001 | Huang et al. ............... 438/264 |
| 6,281,545 | B1 | | 8/2001 | Liang et al. |
| 6,495,898 | B1 | * | 12/2002 | Iwamatsu et al. ........... 257/506 |
| 6,512,263 | B1 | * | 1/2003 | Yuan et al. .................. 257/316 |
| 6,566,707 | B1 | * | 5/2003 | Sudo et al. .................. 257/316 |

* cited by examiner

Primary Examiner—Long Pham
Assistant Examiner—Marcos D. Pizarro-Crespo
(74) Attorney, Agent, or Firm—Finnegan, Henderson, Farabow, Garrett & Dunner, L.L.P.

(57) ABSTRACT

An integrated circuit that includes a first dual-floating gate memory cell having a first floating gate isolated from a second floating gate for storing at least one bit of datum, and a second dual-floating gate memory cell having a third floating gate isolated from a fourth floating gate for storing at least one bit of datum, wherein the first dual-floating gate memory cell and the second dual-floating gate memory cell share a control gate, wherein the second floating gate of the first dual-floating gate memory cell shares an oxide layer with the third floating gate of the second dual-floating gate memory cell, and wherein the oxide layer electrically insulates the second and third floating gates from the control gate.

11 Claims, 9 Drawing Sheets

SELF-ALIGNED DUAL-FLOATING GATE MEMORY CELL AND METHOD FOR MANUFACTURING THE SAME

This is a division of parent application Ser. No. 10/067,889, filed on Feb. 8, 2002 now abandoned; and claims the benefit of U.S. provisional application No. 60/336,737, filed Dec. 7, 2001, all of which are incorporated herein by reference.

FIELD OF THE INVENTION

This invention pertains in general to a semiconductor device and, more particularly, to a dual-floating gate memory cell and method for manufacturing the same.

BACKGROUND OF THE INVENTION

A non-volatile memory cell, such as a flash memory cell, with multiple floating gates to store multiple bits of data is known. Such a memory cell generally includes two floating gates to store two bits of data, and each bit of datum may be stored (programmed) and read individually. U.S. Pat. No. 5,929,480 describes a non-volatile semiconductor memory device having first and second floating gates. However, due to the complexity of some of the known dual-storage memory cell structures, these memory cells cannot be easily scaled, which presents a major obstacle to commercialization. Furthermore, the methods for manufacturing these conventional dual-storage memory cells are complicated and costly. Therefore, there is a need for a dual-storage memory cell with excellent scalability and may be manufactured using existing CMOS technology to minimize cost.

SUMMARY OF THE INVENTION

In accordance with the invention, there is provided an integrated circuit that includes a first dual-floating gate memory cell having a first floating gate isolated from a second floating gate for storing at least one bit of datum, and a second dual-floating gate memory cell having a third floating gate isolated from a fourth floating gate for storing at least one bit of datum, wherein the first dual-floating gate memory cell and the second dual-floating gate memory cell share a control gate, wherein the second floating gate of the first dual-floating gate memory cell shares an oxide layer with the third floating gate of the second dual-floating gate memory cell, and wherein the oxide layer electrically insulates the second and third floating gates from the control gate.

In one aspect, one of the first, second, third and fourth floating gates has a vertical dimension greater than or equal to a horizontal dimension.

In another aspect, the integrated circuit further includes a first isolation oxide to isolate the first floating gate from the second floating gate.

Also in accordance with the present invention, there is provided a method for manufacturing a semiconductor device that includes defining a substrate, providing a dielectric layer over the substrate, depositing a first layer of polysilicon over the dielectric layer, providing a layer of nitride over the first layer of polysilicon, forming a plurality of composite structures, each having a section of the first polysilicon layer and nitride layer, forming a plurality of diffused regions in the substrate between the plurality of composite structures, forming isolation oxides between the plurality of composite structures, removing the sections of the nitride layer, forming a plurality of spacers over the first polysilicon layer and contiguous with sidewalls of the isolation oxides, etching the first polysilicon layer with the plurality of spacers acting as masks, removing the plurality of spacers, forming a layer of inter-gate dielectric over the etched first polysilicon layer, and forming a second polysilicon layer over the inter-gate dielectric layer.

In one aspect, the step of forming a plurality of spacers includes forming a plurality of oxide spacers.

In another aspect, the step of forming a plurality of spacers includes forming a plurality of polysilicon spacers.

Further in accordance with the present invention, there is provided a method for manufacturing a semiconductor device that includes defining a substrate, forming a dielectric layer over the substrate, depositing a first layer of polysilicon over the dielectric layer, providing a layer of nitride over the first layer of polysilicon, etching the layer of nitride and the first layer of polysilicon to form a plurality of composite structures, each having a section of the first polysilicon layer and nitride layer, depositing a layer of oxide using high-density plasma deposition over and between the plurality of composite structures, removing the nitride layer, forming a plurality of spacers over the first polysilicon layer, etching the first polysilicon layer with the plurality of spacers acting as masks, removing the plurality of spacers, forming an inter-gate dielectric layer over the etched first polysilicon layer, and forming a second polysilicon layer over the inter-gate dielectric layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present exemplary embodiments of the invention, examples of which are illustrated in the accompanying drawings. Wherever possible, the same reference numbers will be used throughout the drawings to refer to the same or like parts.

Figure 1:
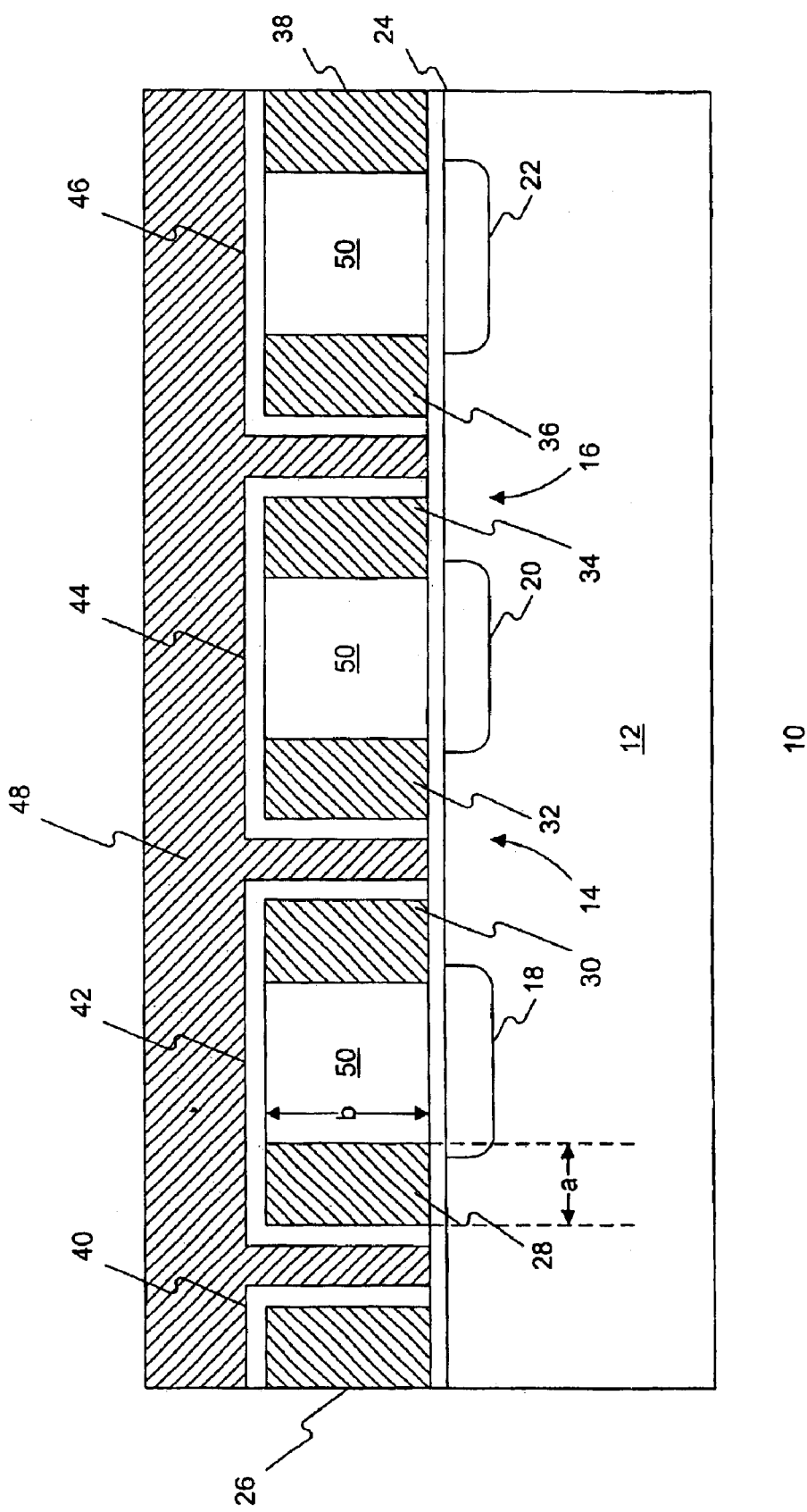
FIG. 1 is a cross sectional view of an integrated circuit consistent with the present invention.

In accordance with the present invention, there is provided a self-aligned dual-floating gate memory cell and method for manufacturing the same. Each of the self-aligned dual-floating gate memory cells of the present invention is capable of storing at least two bits of data, and each bit of datum in the memory cell is programmed and read separately. FIG. 1 is a cross sectional view of an integrated circuit consistent with the present invention. Referring to FIG. 1, an integrated circuit 10 includes a substrate 12, such as silicon, and a plurality of diffused regions 18, 20 and 22 formed therein. The diffused regions 18, 20 and 22 may be n-type or p-type regions. A dielectric layer 24, comprising materials such as silicon dioxide, silicon nitride, and/or silicon oxynitride, is formed over the substrate 12. The dielectric layer 24 is sometimes known as a tunnel oxide. The integrated circuit 10 also includes a first self-aligned dual-floating gate memory cell 14 and a second self-aligned dual-floating gate memory cell 16 of the present invention. The integrated circuit 10 may additionally include other self-aligned dual-floating gate memory cells, but only partially shown in FIG. 1.

The first self-aligned dual-floating gate memory cell 14 includes a first floating gate 30 to store one bit of datum and a second floating gate 32 to store a second bit of datum. The floating gates 30 and 32 are disposed over the dielectric layer 24. The first memory cell 14 also includes a control gate 48, electrically insulated from the first floating gate 30 with a first inter-gate dielectric 42 and the second floating gate 32 with a second inter-gate dielectric 44. The first inter-gate dielectric 42 is contiguous with the top and one side of the first floating gate 30, and the second inter-gate dielectric 44 is contiguous with the top and one side of the second floating gate 32. The first memory cell 14 further includes source/drain regions 18 and 20, and a channel region (not numbered) disposed therebetween. One skilled in the art understands that it is not important how the source/drain regions 18 and 20 are labeled. In addition, as described below, inter-gate dielectric layers 40, 42, 44, and 46 are comprised of the same material and formed at the same time during the manufacturing process. In addition, inter-gate dielectric layers 40, 42, 44, and 46 may be a continuous dielectric layer.

The second self-aligned dual-floating gate memory cell 16 includes a first floating gate 34 and a second floating gate 36, insulated from the substrate 12 by the dielectric layer 24. The second memory cell 16 shares the same control gate 48 with the first memory cell 14. The control gate 48 is electrically insulated from the first floating gate 34 with the second inter-gate dielectric 44 and the second floating gate 36 with a third inter-gate dielectric 46. The second inter-gate dielectric 44 is contiguous with the top and one side of the first floating gate 34, and the third inter-gate dielectric 46 is contiguous with the top and one side of the second floating gate 36. In addition, the second floating gate 32 of the first memory cell 14 shares the same inter-gate dielectric 44 with the first floating gate 34 of the second memory cell 16. The second memory cell 16 further includes source/drain regions 20 and 22, and a channel region (not numbered) disposed therebetween. Each of the floating gates 34 and 36 is capable of storing at least one bit of datum. Floating gates 26 and 38 represent parts of other self-aligned dual-floating gate memory cells.

The floating gates 28 and 30,32 and 34, and 36 and 38 are electrically insulated from each other with isolation oxides 50. In addition, each of the floating gates 28, 30, 32, 34, 36 and 38 has a horizontal dimension, or width, "a" and a vertical dimension, or height, "b". The gate coupling ratio (GCR) of a floating gate indicates the scalability of the integrated circuit, and the greater the GCR, the greater the scalability of the integrated circuit. The GCR may be approximated as $$\frac{(a+b)}{(2a+b)}.$$

Therefore, the GCR may be increased, for example, by decreasing the width "a". In one embodiment, the height of the floating gates is greater than or equal to the width, i.e., $b \geq a$.

In operation, the self-aligned dual-floating gate memory cells of the present invention may be programmed by mid-channel hot-electron injection. As an example, referring again to FIG. 1, the memory cell 14 may be programmed by first programming a first bit, e.g., floating gate 30, and then a second bit, e.g., floating gate 32, or vice versa. To program the first bit, a high voltage, e.g., 8 volts, is provided to the control gate 48, and the source/drain region 18 is coupled to ground. The other source/drain region 20 is provided with a potential lower than that of the control gate, e.g., 4 volts. To program the second bit, a higher voltage, e.g., 8+$\Delta$Vt volts, is provided to the control gate 48, and the source/drain region 20 is coupled to ground. The other source/drain region 18 is provided with a potential lower than that of the control gate, e.g., 4 volts.

The memory cells of the present invention may be erased by channel erase or band-to-band induced hot holes. As an example, to channel erase the memory cell 14, each of the source/drain regions 18 and 20 is provided with a high voltage, e.g., 8 volts. The substrate 12 is provided with the same high voltage, and the control gate 48 is provided with a high negative voltage, e.g., −8 volts. The electrons are erased through the channel between the source/drain regions 18 and 20. The memory cell 14 may also be erased with band-to-band induced hot holes. In operation, the substrate 12 is grounded, the source/drain regions 18 and 20 are provided with a potential of 4 volts, and the control gate 48 is provided with a potential of −8 volts.

Finally, the first bit of the memory cell 14 may be read by applying 3 volts to the control gate 48, 1.5 volts to the source/drain region 18 and a round potential to the source/drain region 20. Conversely, the second bit of the memory cell 14 may be read by applying 3 volts to the control gate 48, 1.5 volts to the source/drain region 20 and a ground potential to the source/drain region 18.

Figure 2:
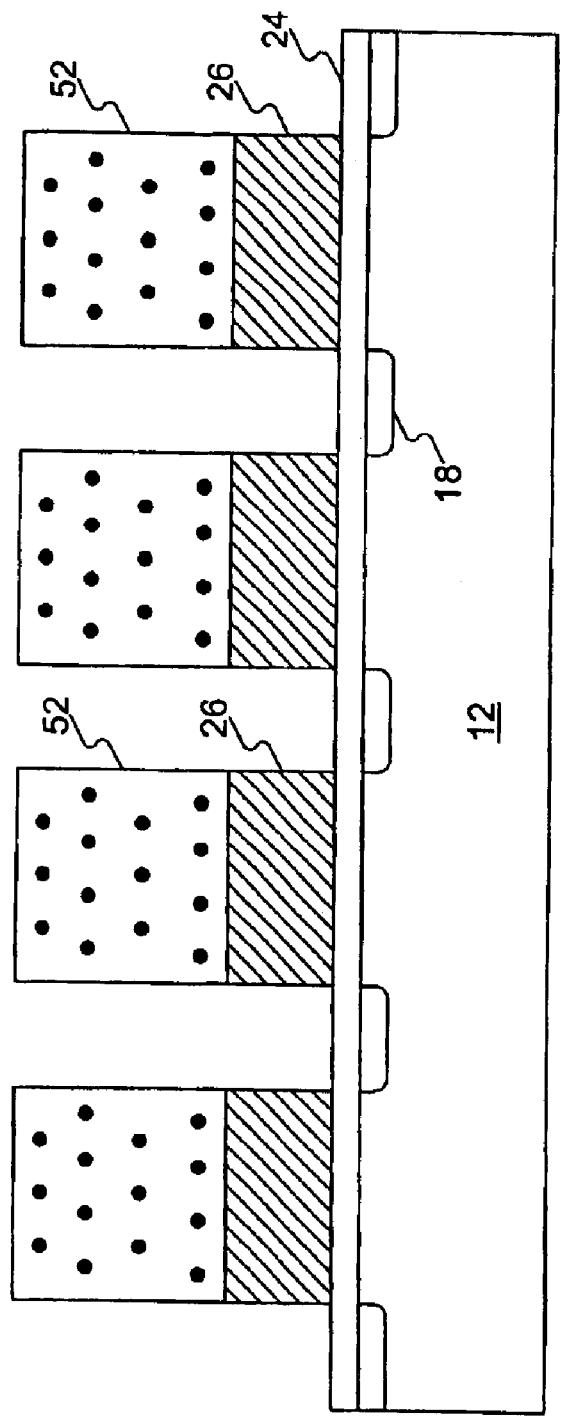
FIGS. 2–9 are cross sectional views of a method for manufacturing an integrated circuit consistent with the present invention.

FIGS. 2–7 are cross sectional views of a method for manufacturing an integrated circuit having self-aligned memory cells consistent with the present invention. Referring to FIG. 2, conventional CMOS manufacturing processes may be used to define a substrate 12, form the shallow trench isolations (not shown), and define p-wells and n-wells (not shown). A dielectric layer 24 is then formed over the substrate 12. A first layer of polysilicon 26 is deposited over the dielectric layer 24. A layer of nitride 52 is then deposited over the first layer of polysilicon 26. The structure comprising the first layer of polysilicon 26 and layer of nitride 52 is masked, patterned, and etched to form a plurality of composite structures having sections of the first polysilicon layer 26 and nitride layer 52. The mask is then removed. With the composite structures acting as masks, impurities are implanted into the exposed areas of the substrate 12 to form a plurality of diffused regions 18. The diffused regions 18 later become source/drain regions of memory cells. A step of oxidation anneal follows, in part, to diffuse the regions 18 further into the substrate 12.

Figure 3:
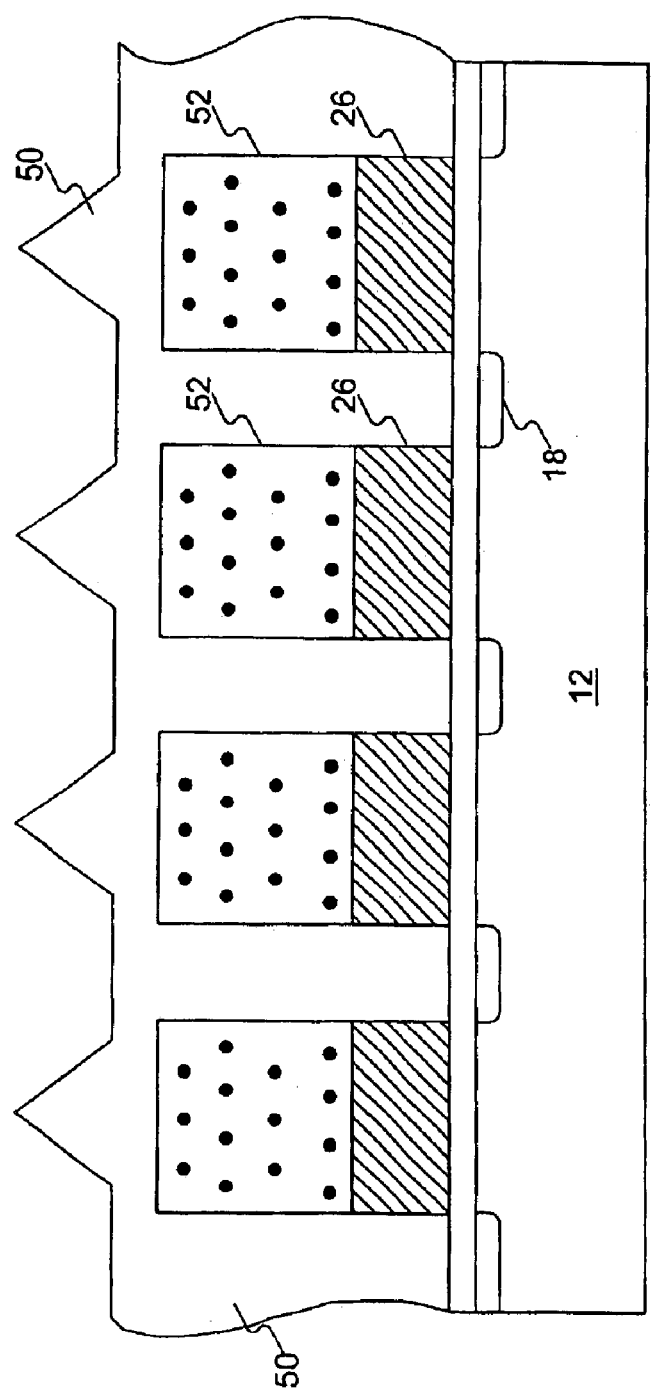
Figure 4:
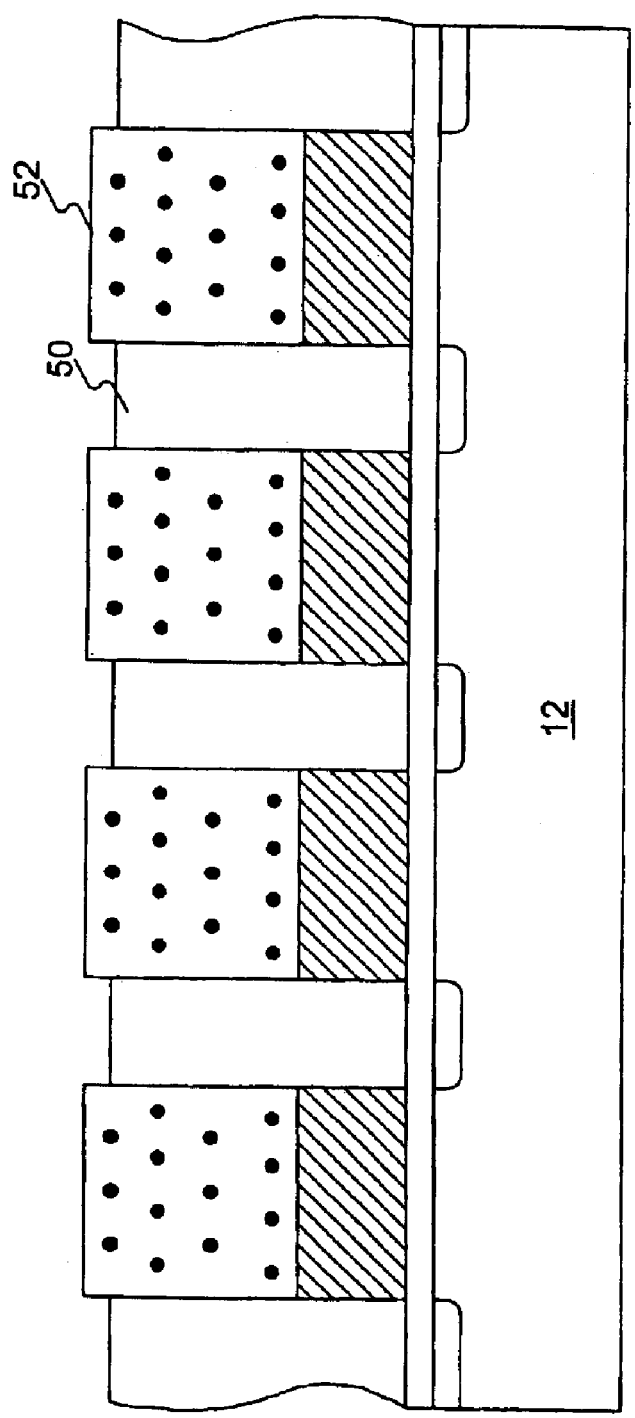

Referring to FIG. 3, high-density plasma (HDP) oxide deposition is performed to coat the entire integrated circuit structure with oxide, forming an oxide layer 50. The HDP deposition process is capable of filling the areas between the composite structures to provide adequate isolation between the composite structures. In addition, because of the inherent simultaneous deposition and etching characteristics of the HDP deposition process, a plurality of peaks, or bumps, are formed on the top surface of the oxide layer 50. Referring to FIG. 4, these peaks are removed by chemical-mechanical polishing (CMP), with the sections of the nitride layer 52 acting as polish stop.

Figure 5:
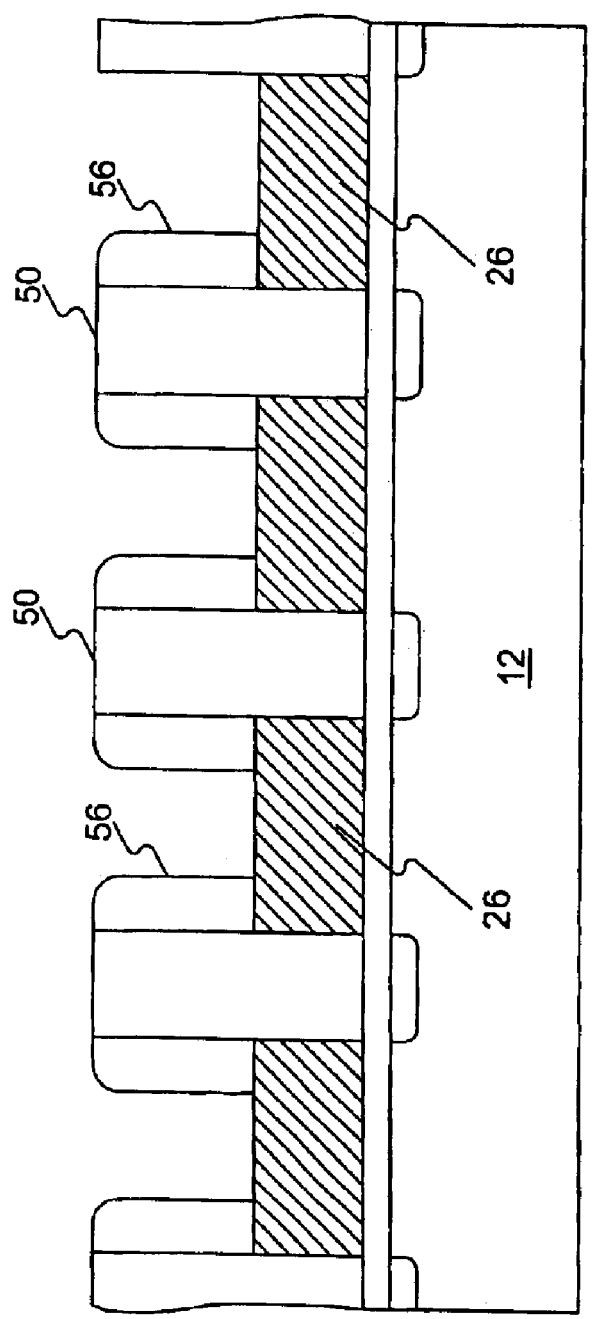
Figure 6:
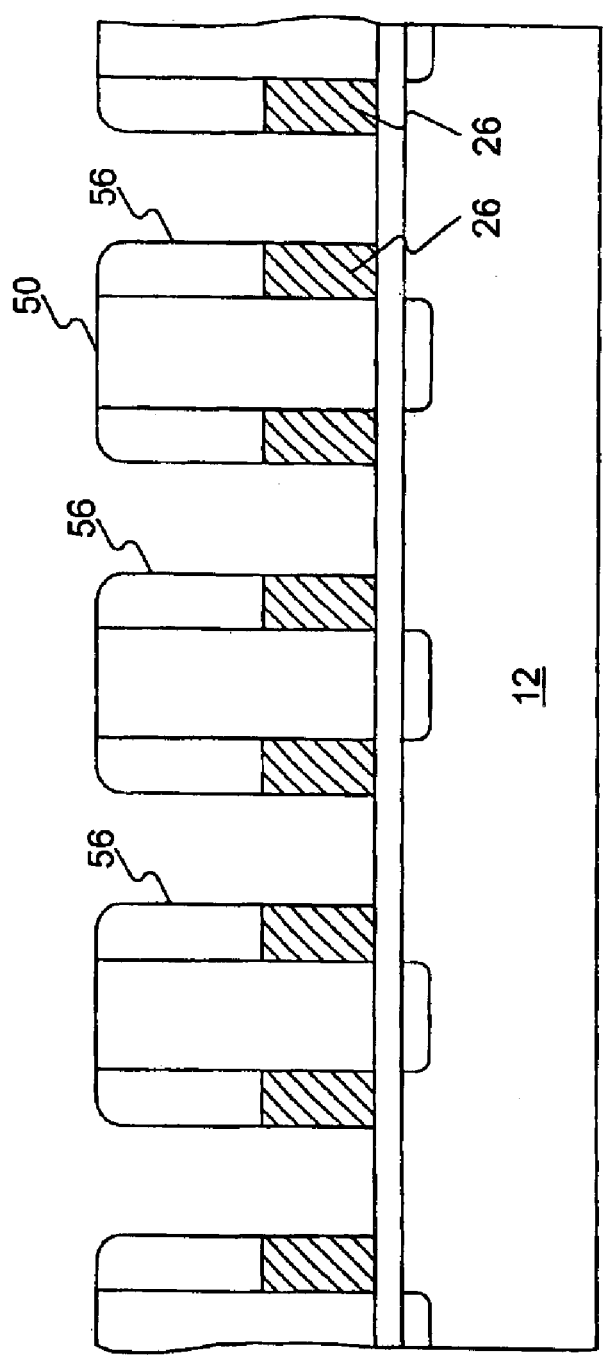

Referring to FIG. 5, after the CMP, the sections of the nitride layer 52 are removed. Oxide chemical-vapor deposition (CVD) follows to coat the entire integrated circuit structure with oxide. A step of oxide spacer etch then follows to form a plurality of oxide spacers 56. The oxide spacers 56 are formed over the sections of the first polysilicon layer 26 and contiguous with the sidewalls of the isolation oxides 50. As shown in FIG. 6, using the oxide spacers 56 as masks, the sections of the first polysilicon layer 26 is etched further to form additional sections of the first polysilicon layer 26. Each of the further etched sections of the first polysilicon layer 26 becomes a floating gate.

Figure 7:
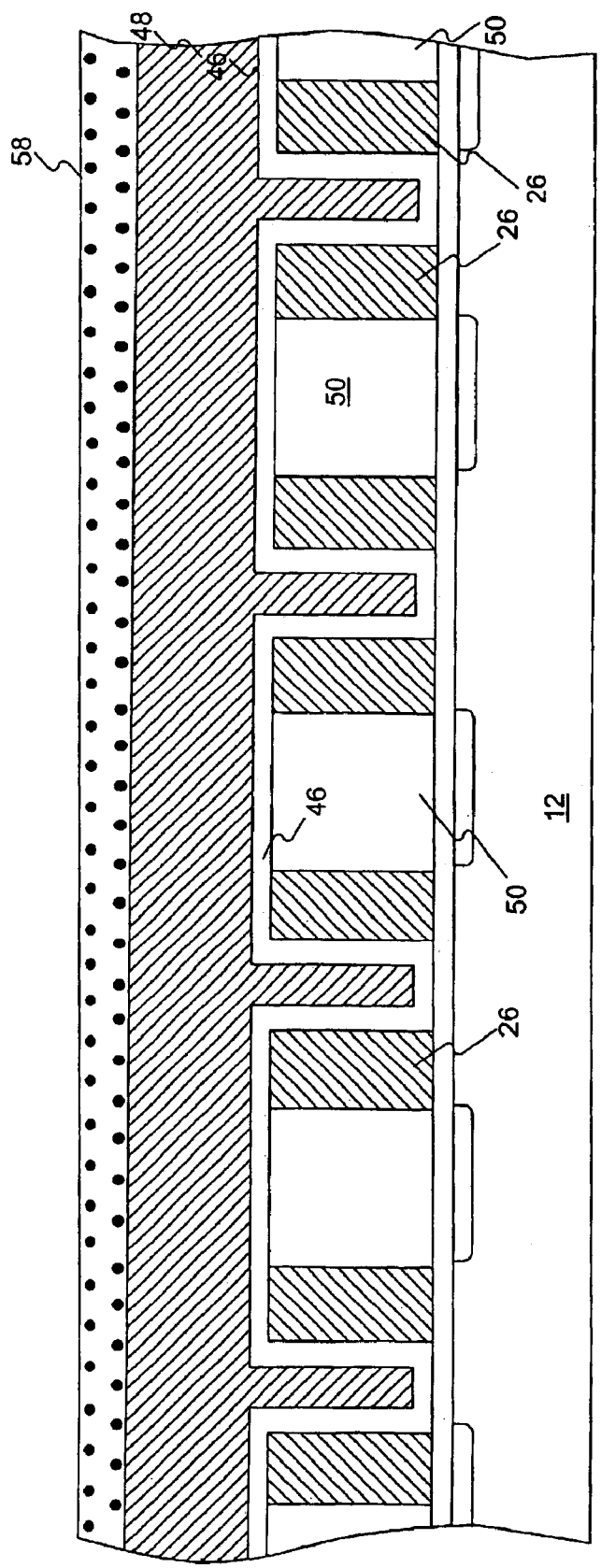

Referring to FIG. 7, a step of oxide CMP is performed to remove the oxide spacers 56 and portions of the isolation oxides 50. A layer of inter-gate dielectric 46 is then formed over the floating gates 26 and isolation oxides 50. A second layer of polysilicon 48 is deposited over the inter-gate dielectric layer 46 to form the control gate. Conventional CMOS manufacturing steps then follow to form a layer of gate silicide or metal 58 and contacts (not shown).

Figure 8:
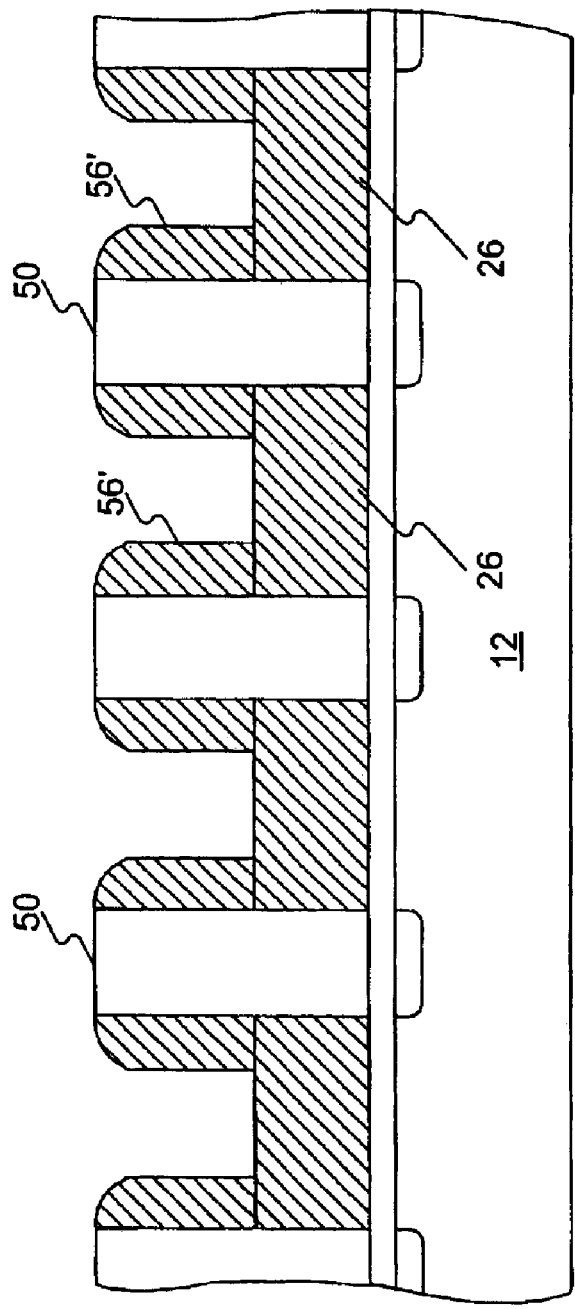
Figure 9:
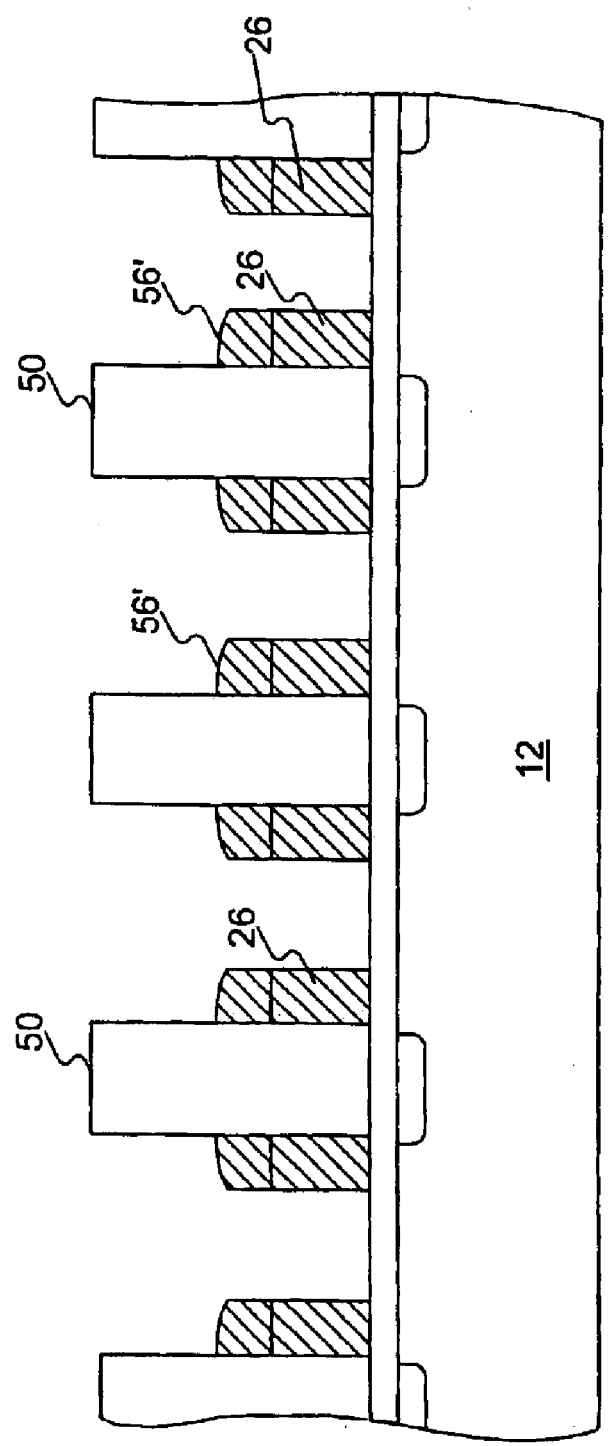

In another embodiment of the present invention, the manufacturing process as described above relative to FIGS. 2–4 remains the same. Referring to FIG. 8, after the sections of the nitride layer 52 are removed, a step of polysilicon chemical-vapor deposition (CVD) is performed to deposit a layer of polysilicon 56'. Polysilicon spacer etch follows to form a plurality of polysilicon spacers 56' over the sections of the first polysilicon layer 26 and contiguous with the sidewalls of the isolation oxides 50. Using the polysilicon spacers 56' as masks, the sections of the first polysilicon layer 26 is etched further to form additional sections of the first polysilicon layer 26 as shown in FIG. 9. Each of the further etched sections of the first polysilicon layer 26 becomes a floating gate. A portion of each of the polysilicon spacers 56' is also removed during etching of the first polysilicon layer 26. The remaining steps of this embodiment are the same as those described in reference to FIG. 7 above.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a semiconductor device, comprising:

defining a substrate;

forming a dielectric layer over the substrate;

depositing a first layer of polysilicon over the dielectric layer;

providing a layer of nitride over the first layer of polysilicon;

etching the layer of nitride and the first layer of polysilicon to form a plurality of composite structures, each having a section of the first polysilicon layer and nitride layer;

depositing a layer of oxide using high-density plasma deposition over and between the plurality of composite structures;

removing the nitride layer;

forming a plurality of spacers over the first polysilicon layer;

etching the first polysilicon layer with the plurality of spacers acting as masks;

removing the plurality of spacers;

forming an inter-gate dielectric layer over the etched first polysilicon layer; and forming a second polysilicon layer over the inter-gate dielectric layer.

2. The method as claimed in claim 1, wherein the spacers are oxide spacers.

3. The method as claimed in claim 1, wherein the spacers are polysilicon spacers.

4. The method as claimed in claim 1, further comprising a step of chemical-mechanical polishing of the oxide layer.

5. A method for manufacturing a semiconductor device, comprising:

defining a substrate;

providing a dielectric layer over the substrate;

depositing a first layer of polysilicon over the dielectric layer;

providing a layer of nitride over the first layer of polysilicon;

forming a plurality of composite structures, each having a section of the first polysilicon layer and nitride layer;

forming a plurality of diffused regions in the substrate between the plurality of composite structures;

forming isolation oxides between the plurality of composite structures;

removing the sections of the nitride layer;

forming a plurality of spacers over the first polysilicon layer and contiguous with sidewalls of the isolation oxides;

etching the first polysilicon layer with the plurality of spacers acting as masks;

removing the plurality of spacers;

forming a layer of inter-gate dielectric over the etched first polysilicon layer; and forming a second polysilicon layer over the inter-gate dielectric layer.

6. The method as claimed in claim 5, wherein the step of forming isolation oxides between the plurality of composite structures includes a step of high density plasma oxide deposition.

7. The method as claimed in claim 5, further comprising a step of chemical-mechanical polishing of the isolation oxides.

8. The method as claimed in claim 5, wherein the step of forming a plurality of spacers includes forming a plurality of oxide spacers.

9. The method as claimed in claim 8, further comprising a step of depositing a layer of oxide.

10. The method as claimed in claim 5, wherein the step of forming a plurality of spacers includes forming a plurality of polysilicon spacers.

11. The method as claimed in claim 10, further comprising a step of depositing a layer of polysilicon.

* * * * *